United States Patent [19]

Minami et al.

[11] 4,035,668

[45] July 12, 1977

[54] INPUT-INTERRUPTION TYPE DELAYED TURN-OFF CONTROL TIMER

[75] Inventors: Shunji Minami, Katano; Shunzo Oka, Hirakata, both of Japan

[73] Assignee: Matsushita Electric Industrial Co., Ltd., Japan

[21] Appl. No.: 667,641

[22] Filed: Mar. 17, 1976

[30] Foreign Application Priority Data

Mar. 20, 1975 Japan .................. 50-34159
Mar. 20, 1975 Japan .................. 50-38278

[51] Int. Cl.² .................. H03K 17/56; H03K 5/13
[52] U.S. Cl. .................. 307/293; 307/246; 307/251; 307/255; 307/304; 361/197
[58] Field of Search .......... 307/246, 251, 293, 304, 307/255; 317/148.5 R

[56] References Cited
U.S. PATENT DOCUMENTS

| | | | |
|---|---|---|---|
| 2,974,258 | 3/1961 | Garthwaite | 317/101 |
| 3,409,901 | 11/1968 | Dost et al. | 307/293 |
| 3,463,993 | 8/1969 | Beck et al. | 307/304 |
| 3,633,050 | 1/1972 | Zajac | 307/293 |
| 3,721,832 | 3/1973 | Lee | 307/293 |
| 3,894,249 | 7/1975 | Minami et al. | 307/304 |
| 3,925,720 | 12/1975 | Minami et al. | 307/304 |

Primary Examiner—Stanley D. Miller, Jr.
Attorney, Agent, or Firm—Burgess, Ryan and Wayne

[57] ABSTRACT

The invention discloses an electronic input-interruption timer for use with an electrical appliance such as a washing machine, a fan, a refrigerator and so on. The timer comprises an integrator consisting of an input resistor and a capacitor, a switching element, a MOS field-effect transistor, a discharge resistor, and a switching circuit operable in response to the magnitude of the drain current of the field-effect transistor; the field-transistor, the switching element, the capacitor and the discharge resistor being embedded or potted in a molded plastic insulation. Since the capacitor and the discharge resistor are completely air- and water-tightly sealed, the highly reliable and dependable operation may be ensured even when used with a water-handling appliance such as a washing machine.

5 Claims, 10 Drawing Figures

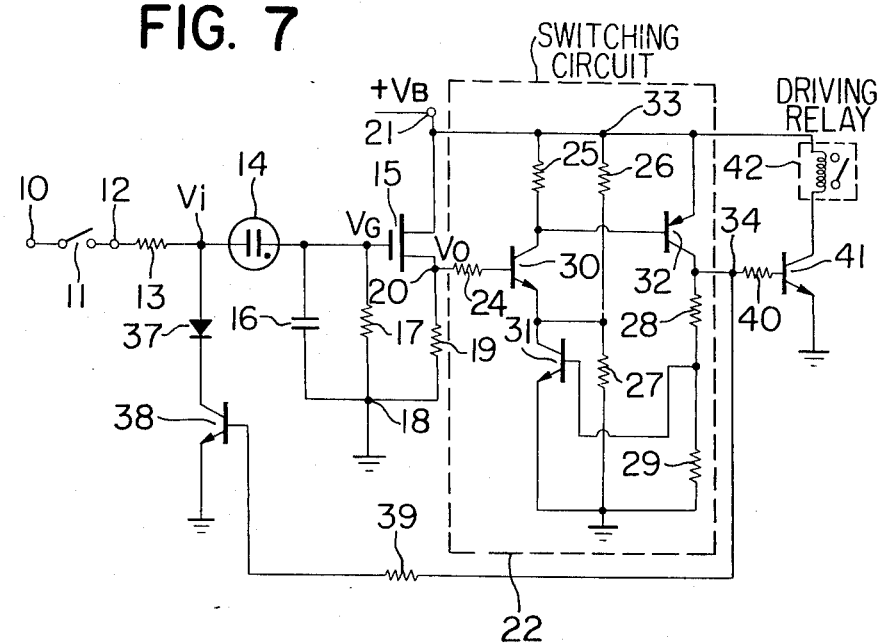
FIG. 7
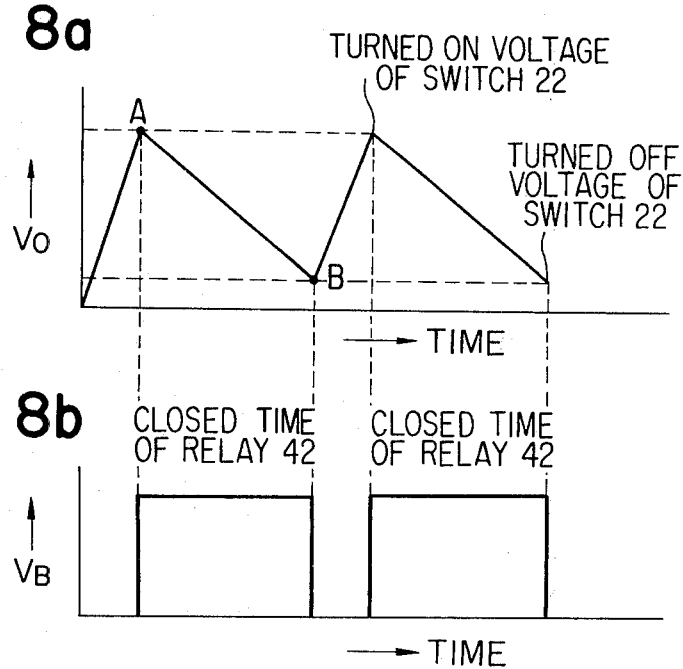
FIG. 8a
FIG. 8b

INPUT-INTERRUPTION TYPE DELAYED TURN-OFF CONTROL TIMER

BACKGROUND OF THE INVENTION

The present invention relates to an electronic timer especially adapted for use with an electrical appliance such as a washing machine, refregirator or the like for interrupting the input thereto.

In general, mechanical timers using a spring and toothed wheels have been used in the electrical appliance. Even when these mechanical timers are air- and water-tightly sealed, the intrusion of moisture or water vapor through the clearance of the rotary shaft cannot be avoided so that the smooth meshing between the toothed wheels is adversely affected and the wear of the toothed wheels results, causing the error in setting a time.

Of the electronic timers, the so-called CR timers have been widely used, but have a distinct defect that a time interval set varies over a wide range depending upon environmental conditions, especially moisture. Therefore they cannot be used with a water-handling appliance such as a washing machine.

SUMMARY OF THE INVENTION

One of the objects of the present invention is therefore to provide an electronic input-interruption timer which is highly reliable and dependable in operation.

Another object of the present invention is to provide an electronic timer in which a time-constant circuit consisting of a capacitor and a discharge resistor is completely air- and water-tightly sealed so that the reliable operation may be ensured even when used in conjunction with a water-handling appliance such as a washing machine.

A further object of the present invention is to provide an electronic timer which is very simple in construction and is adapted for use with a refregirator so that the alternate freezing and defrosting operations may be carried out at a predetermined time interval.

To the above and other ends, the present invention provides an electronic timer comprising an input resistor with its one end connected to an input terminal, an input-interruption switching element with its one end connected to the other end of the input resistor, a MOS field-effect transistor with its gate connected to the other end of the switching element, a RC parallel circuit consisting of a nonpolarized electrolytic capacitor and a discharge capacitor and connected between the gate of the field-effect transistor and the ground, a switching circuit connected to the output terminal of the field-effect transistor and operable in response to the output therefrom, and the field-effect transistor, the switching element and the RC parallel circuit being embedded or potted in a molded plastic insulation as a module.

BRIEF DESCRIPTION OF THE DRAWING

FIGS. 5, 6 and 7 are circuit diagrams of second, third, and fourth embodiments, respectively, of the present invention; and FIGS. 8a and 8b are views used for the explanation of the mode of operation of the fourth embodiment.

Same reference numerals are used to designate similar parts throughout the FIGURES.

DESCRIPTION OF THE PREFERRED EMBODIMENTS

First Embodiment, FIGS. 1 through 4

Figure 1:
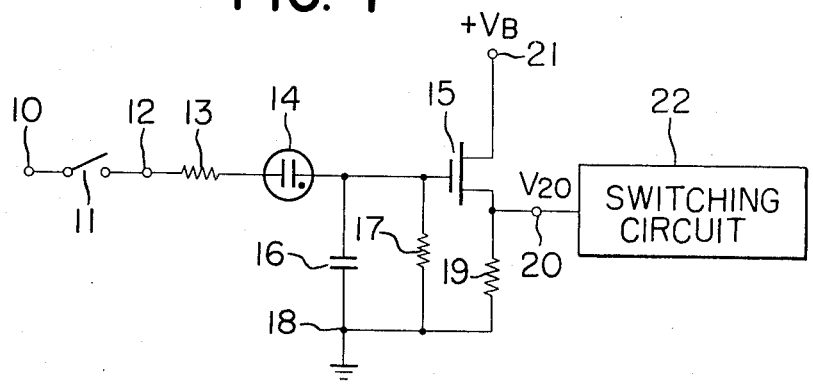
FIG. 1 is a circuit diagram of a first embodiment of the present invention.

In FIG. 1 there is shown a first embodiment of an input-interruption timer in accordance with the present invention, comprising a switch 11 having its movable contact connected to an input terminal 10, an input resistor 13 having its one end connected to the stationary contact of the switch 11, a neon bulb 14 having its one electrode connected to the other end of the input resistor 13, a MOS field-effect transistor 15 having its gate connected to the other electrode of the neon bulb 14, and a switching circuit generally indicated by the reference numeral 22 and connected to an output terminal 20 which in turn is connected to the source of the field-effect transistor 15. A parallel circuit consisting of a nonpolarized electrolytic capacitor 16 and a discharge resistor 17 is connected between the gate of the field-effect transistor 15 and a junction 18, and a source resistor 19 is interconnected between the source of the field-effect transistor 15 and the junction 18. The drain of the transistor 15 is connected to a $+V_B$ terminal.

Figure 2:
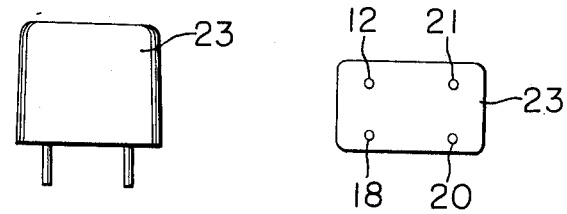
FIG. 2 shows the front side and bottom of a timer module.

As shown in FIG. 2, the input resistor 13, the neon bulb 14, the field-effect transistor 15, the capacitor 16, the discharge resistor 17 and the source resistor 19 are embedded in a molded plastic insulation 23 made of silicon rubber or epoxy resin, and the input terminal 10, the output terminal 20, the junction 18 and the $+V_B$ terminal 21 are extended from the bottom of the molded plastic insulation 23, whereby these parts may be provided in the form of a cordwood module. However the input and source resistors 13 and 19 may not be included in the module.

Figure 3:
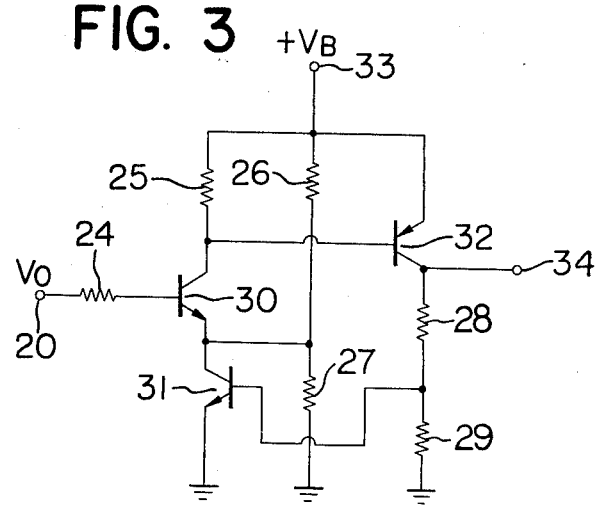
FIG. 3 is a circuit diagram of a switching circuit of the first embodiment.

In FIG. 3 there is shown a circuit diagram of the switching circuit 22 comprising three transistors 30, 31 and 32, resistors 24, 25, 28 and 29 and a voltage divider consisting of resistors 26 and 27. A $+V_B$ terminal is connected to the collector of the transistor 30 through the resistor 25, to one end of the resistor 26 and to the emitter of the transistor 32, and the collector of the transistor 32 is connected to an output terminal 34 which in turn is connected to a controlled appliance such as a washing machine, a fan or the like.

Next the mode of operation of the first embodiment will be described. When the switch 11 is closed, the neon bulb 14 conducts so that the capacitor 16 is charged and consequently the output voltage Vo at the output terminal 20 rises in proportion to the gate voltage $V_G$ of the transistor 15. The gate voltage $V_G$, that is the input voltage E minus the voltage across the neon bulb 14 is given by $$V_G = \frac{R_2 \cdot E}{R_1 + R_2}(1 - e^{-\frac{1}{R_1 // R_2 \times C}t})$$

where $R_1, R_2$ = values of resistors 13 and 17,
$C$ = value of capacitor 16, and t = time, in seconds.

Figure 4A:
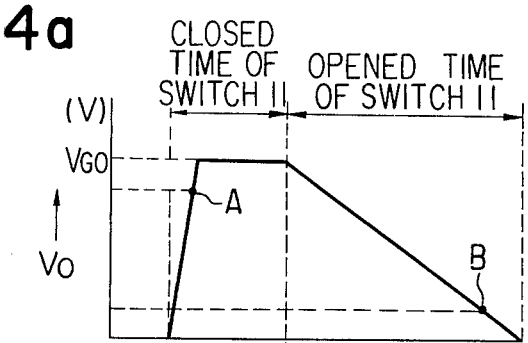
FIGS. 4a and 4b are views used for the explanation of the mode of operation of the first embodiment.

The switching circuit 22 shown in FIG. 3 is so designed that it is turned on when the output voltage Vo rises to A as shown in FIG. 4a so as to supply the voltage Vo to the load or appliance. The voltage A is selected lower than the maximum gate voltage $V_G$ which is the voltage across the capacitor 16.

Next when the switch 10 is opened, the neon bulb 14 is turned off so that the charge on the capacitor 16 is discharged through the resistor 17. The discharge is in proportion to the time constant RC of the discharge resistor 17 and the capacitor 16. Therefore the gate voltage $V_G$ is given by $$V_G = V_{GO} \cdot e^{-\frac{1}{R_2 \cdot C} t}$$

where $V_{GO}$ = Maximum voltage charged across capacitor 16.

As the capacitor 16 is discharged and consequently the gate voltage $V_G$ drops, the output voltage Vo also drops, and the switching circuit 22 is instantly turned off when the output voltage Vo drops to B which is equal to the cutoff voltage (about 0.6 V) of the transistor 30 in the switching circuit 22.

The values of the resistors 13 and 17 are so selected as to satisfy the following condition:

$$R_1 // R_2 << R_2.$$

Figure 4B:
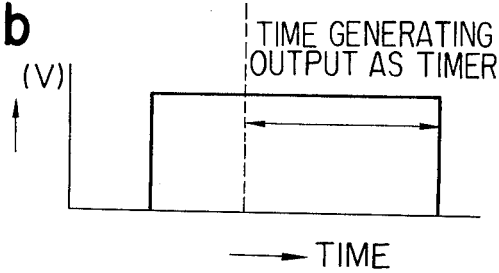

Then the switching circuit 22 is turned on a few microseconds (msec) after the switch 11 is closed, and the timer interval set by the timer; that is, the time interval from the time when the switch 11 is opened to the time when the output voltage Vo drops to B (See FIG. 4a) is determined as shown in FIG. 4b.

Figure 5:
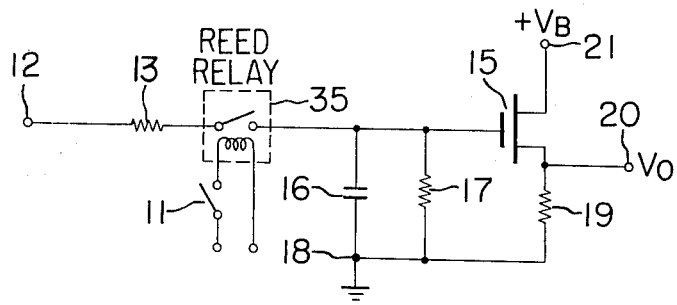

Second Embodiment, FIG. 5

The second embodiment shown in FIG. 5 is substantially similar in construction to the first embodiment shown in FIG. 1 except that instead of the neon bulb 14 a reed relay 35 is used. An input terminal 12 is connected to a power supply, and the coil of the reed relay 35 is also connected through the switch 11 to the power source.

The mode of operation of the second embodiment with the above construction is also substantially similar to that of the first embodiment. That is, when the switch 11 is closed, the reed relay 35 is closed so that the capacitor 16 is charged, and when the switch 11 is opened, the read relay 35 is also opened so that the capacitor 16 is discharged.

Figure 6:
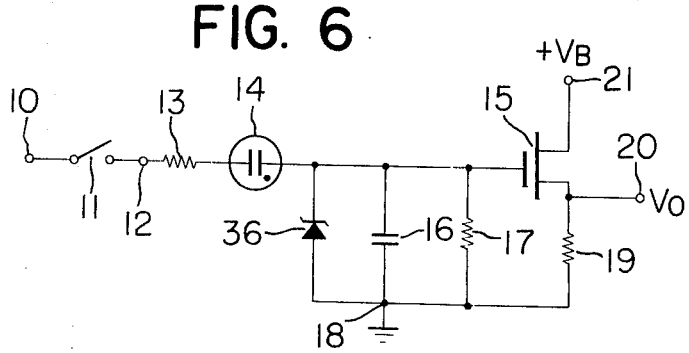

Third Embodiment, FIG. 6

The third embodiment shown in FIG. 6 is also substantially similar in construction to the first embodiment shown in FIG. 1 except that a zener diode 36 is connected in parallel with the capacitor 16. Therefore, the maximum gate voltage $V_G$ may be maintained at a predetermined level, and the variation in ionization voltage of the neon bulb 14 due to its aging as well as the variation in closing time of the switch 11 may be compensated, whereby the highly reliable performance of the timer may be ensured.

Fourth Embodiment, FIGS. 7 and 8

The fourth embodiment shown in FIG. 7 is substantially similar in construction to the first embodiment shown in FIG. 1 except that the fourth embodiment further includes a diode 37, a transistor 38, a driving transistor 41 and a driving relay 42. More particularly, one electrode of the neon bulb 14 is connected through the diode 37 to the collector of the npn transistor 38. The emitter of the transistor 38 is grounded while the base is connected through a resistor 39 to the output terminal 34 of the switching circuit 22. The output terminal 34 is connected through a resistor 40 to the base of the driving transistor 41 with its emitter grounded. The collector of the driving transistor 41 is connected through the coil of the relay 42 to the $+V_B$ terminal. The contacts of the relay 42 are connected to a controlled electrical appliance such as a refrigerator (not shown).

Next will be described the mode of operation of the fourth embodiment which is assumed to be operatively coupled to a defrosting device of a home refregirator for the sake of explanation. When the switch 11 is closed, the neon bulb 14 conducts so that the capacitor 16 is charged and consequently the output voltage at the output terminal 20 rises in proportion to the gate voltage $V_G$ of the field-effect transistor 15. As is the case of the first embodiment, the gate voltage $V_G$ is given by $$V_G = \frac{R_2 \cdot E}{R_1 + R_2} (1 - e^{-\frac{1}{R_1 // R_2 \times C} t})$$

With the increase in gate voltage $V_G$, that is the voltage across the capacitor 16, the drain current of the field-effect transistor 15 flowing through the resistor 19 is increased so that the output voltage Vo is increased accordingly. As shown in FIG. 8a, when the output voltage Vo rises to the point A, the switching circuit 22 is turned on as shown in FIG. 8b so that the output is applied through the control resistor 39 in the feedback system to the transistor 38. The transistor 38 is therefore turned on.

When the transistor 38 is turned on, the voltage Vi at the junction between the input resistor 13 and the neon bulb 14 is given by $$Vi = \frac{Rd + Rt}{R_1 + Rd + Rt} \times 100[V] << 100[V]$$

where
$R_1$ = value of resistor 13,
Rd = internal resistance of diode 37, and
Rt = internal resistance of transistor 38.

Since the voltage Vi is below the extinction voltage of the neon bulb 14, the latter is turned off so that the capacitor 16 is discharged through the discharge resistor 17 and consequently the gate voltage $V_G$ gradually drops, causing the output voltage Vo to drop accordingly. When the output voltage Vo drops to the level B shown in FIG. 8a, the switching circuit 22 is turned off as shown in FIG. 8b. Since no output from the switching circuit 22 is applied to the base of the transistor 38, the latter is turned off so that the neon bulb 14 conducts again as long as the switch 11 remains closed and consequently the capacitor 16 is charged again. Therefore the above operation is cycled.

When the switching circuit 22 is turned on, the driving relay 42 is closed so that the defrosting device is turned on, but when the switching circuit 22 is turned off the driving relay 42 is opened so that the defrosting device is turned off. Thus the defrosting device may be cylically operated with a recurrence rate shown in FIG. 8b.

What is claimed is:
1. An input-interruption timer comprising
   a. an input resistor with one end connected to an input terminal,
   b. an input-interruption switching element with one end connected to the other end of said input resistor,
   c. a MOS field-effect transistor with its gate connected to the other end of said switching element,
   d. a parallel circuit consisting of a nonpolarized electrolytic capacitor and a discharge resistor and connected between the gate of said field-effect transistor and circuit ground,
   e. a switching circuit means connected to the output terminal of said field-effect transistor for producing an on and off switching signal in response to the rise and fall of output signal level from said field-effect transistor,
   f. said field-effect transistor, said switching element and said parallel circuit being embedded or potted in a molded plastic insulation, and
   g. said discharge resistor comprising means for providing the sole discharge path for said capacitor.
2. An input-interruption timer as set forth in claim 1 wherein said switching element is a neon bulb.
3. An input-interruption timer as set forth in claim 1 wherein said switching element is a reed relay.
4. An input-interruption timer as set forth in claim 1 wherein a zener diode is interconnected directly in parallel with the capacitor so that the time interval set by said timer can be always maintained constant.
5. An input-interruption timer as set forth in claim 1 further comprising
   a transistor with a collector connected to the junction between said input resistor and said switching element, its emitter grounded and its base connected in a feedback path to the output terminal of said switching circuit so that said switching circuit can by cyclically turned on and off with a predetermined recurrence rate.

* * * * *